(12) United States Patent
Kim et al.

(10) Patent No.: US 9,972,683 B2
(45) Date of Patent: May 15, 2018

(54) SEMICONDUCTOR DEVICE AND METHOD OF FABRICATING THE SAME

(71) Applicant: SAMSUNG ELECTRONICS CO., LTD., Suwon-si, Gyeonggi-Do (KR)

(72) Inventors: Dong-Kwon Kim, Gimcheon-si (KR); Ji-Hoon Cha, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/145,040

(22) Filed: May 3, 2016

(65) Prior Publication Data
US 2017/0117362 A1     Apr. 27, 2017

Related U.S. Application Data

(60) Provisional application No. 62/246,904, filed on Oct. 27, 2015.

(51) Int. Cl.
| | |
|---|---|
| *H01L 29/10* | (2006.01) |
| *H01L 21/8238* | (2006.01) |
| *H01L 27/11* | (2006.01) |
| *H01L 27/092* | (2006.01) |
| *H01L 29/161* | (2006.01) |
| *H01L 29/165* | (2006.01) |
| *H01L 29/16* | (2006.01) |
| *H01L 49/02* | (2006.01) |

(52) U.S. Cl.
CPC .. *H01L 29/1054* (2013.01); *H01L 21/823807* (2013.01); *H01L 21/823821* (2013.01); *H01L 27/0924* (2013.01); *H01L 27/1104* (2013.01); *H01L 27/1116* (2013.01); *H01L 28/00* (2013.01); *H01L 29/161* (2013.01); *H01L 29/165* (2013.01); *H01L 29/1608* (2013.01); *H01L 27/092* (2013.01)

(58) Field of Classification Search
CPC ......... H01L 29/1054; H01L 21/823821; H01L 21/823807; H01L 27/0924; H01L 27/1116; H01L 29/165; H01L 29/1608; H01L 27/1104; H01L 29/161; H01L 27/092
See application file for complete search history.

(56) References Cited

U.S. PATENT DOCUMENTS

| | | |
|---|---|---|
| 5,629,534 A | 5/1997 | Inuzuka et al. |
| 6,531,754 B1 | 3/2003 | Nagano et al. |
| 6,696,328 B2 | 2/2004 | Rhee et al. |
| 7,132,322 B1 | 11/2006 | Greene et al. |
| 7,871,878 B2 | 1/2011 | Wang et al. |
| 8,174,095 B2 | 5/2012 | Irisawa et al. |

(Continued)

*Primary Examiner* — Latanya N Crawford
(74) *Attorney, Agent, or Firm* — F. Chau & Associates, LLC

(57) ABSTRACT

A method of fabricating a semiconductor device is provided as follows. A strain relaxed buffer (SRB) layer is formed on a substrate. The SRB layer is formed of a first silicon germanium alloy (SiGe) layer which has a first atomic percent of germanium (Ge) atoms. A heterogeneous channel layer is formed on the SRB layer. The heterogeneous channel layer includes a silicon layer on a first region of the SRB layer and a second SiGe layer on a second region of the SRB layer. The second SiGe layer includes a second atomic percent of germanium greater than the first atomic percent of germanium atoms. The silicon layer is in contact with the second SiGe layer.

14 Claims, 17 Drawing Sheets

(56) References Cited

U.S. PATENT DOCUMENTS

| | | | |
|---|---|---|---|
| 8,580,659 B2 | 11/2013 | Zhang et al. | |
| 8,765,534 B2 | 7/2014 | Owens | |
| 8,975,168 B2 | 3/2015 | Liu et al. | |
| 9,171,904 B2 * | 10/2015 | Eneman | H01L 29/1054 |
| 9,391,171 B2 * | 7/2016 | Chan | H01L 29/785 |
| 2003/0219938 A1 | 11/2003 | Rhee et al. | |
| 2013/0285117 A1 | 10/2013 | Majumdar et al. | |
| 2014/0070321 A1 | 3/2014 | Gerhardt et al. | |
| 2015/0145048 A1 | 5/2015 | Cheng et al. | |
| 2016/0104799 A1 * | 4/2016 | Qi | H01L 29/7849 257/29 |
| 2016/0225674 A1 * | 8/2016 | Jacob | H01L 21/82382 |
| 2016/0233245 A1 * | 8/2016 | Hashemi | H01L 27/1211 |
| 2016/0379895 A1 * | 12/2016 | Hashemi | H01L 27/1211 438/412 |

\* cited by examiner

1000

700

SEMICONDUCTOR DEVICE AND METHOD OF FABRICATING THE SAME

CROSS-REFERENCE TO RELATED APPLICATION

This application claims the benefit under 35 U.S.C. § 119(e) to United States Provisional Patent Application No. 62/246,904, filed on Oct. 27, 2015 in the United States Patent & Trademark Office, the disclosure of which is incorporated by reference herein in its entirety.

TECHNICAL FIELD

The present inventive concept relates to a semiconductor device and a method of fabricating the same.

DISCUSSION OF RELATED ART

Semiconductor devices include an N-type field effect transistor (NFET) and a P-type field effect transistor (PFET). With various connections among NFETs and PFETs, a logic switch, an inverter, or a memory cell of a static random access memory (SRAM) device are formed in the semiconductor devices. As the semiconductor devices become smaller, the semiconductor devices may include three dimensional transistors such as a fin type field effect transistor (FinFET).

SUMMARY

According to an exemplary embodiment of the present inventive concept, a method of fabricating a semiconductor device is provided as follows. A strain relaxed buffer (SRB) layer is formed on a substrate. The SRB layer is formed of a first silicon germanium alloy which has a first atomic percent of germanium (Ge) atoms. A heterogeneous channel layer is formed on the SRB layer. The heterogeneous channel layer includes a silicon layer on a first region of the SRB layer and a second SiGe layer on a second region of the SRB layer. The second SiGe layer is formed of a second silicon germanium alloy which includes a second atomic percent of germanium atoms greater than the first atomic percent of germanium atoms. The silicon layer is in contact with the second SiGe layer.

According to an exemplary embodiment of the present inventive concept, a method of fabricating a semiconductor device is provided as follows. A first silicon germanium alloy (SiGe) layer is formed on a substrate. A heterogeneous channel layer is formed on the first SiGe layer. The heterogeneous channel layer includes a silicon layer on a first region of the first SiGe layer and a second SiGe layer on a second region of the first SiGe layer. A germanium atomic percent of the second SiGe layer is greater than a germanium atomic percent of the first SiGe layer. A first fin type structure is formed by patterning the silicon layer to a patterned silicon layer. The first fin type structure includes the patterned silicon layer. A second fin type structure is formed by patterning the second SiGe layer to a patterned SiGe layer. The second fin type structure includes the patterned second SiGe layer spaced apart from the patterned silicon layer. A gate oxide layer is formed on the patterned silicon layer and the patterned second SiGe layer. A gate electrode is formed on the gate oxide layer.

According to an exemplary embodiment of the present inventive concept, a semiconductor device is provided as follows. A first fin type pattern and a second fin type pattern are disposed on a substrate. A gate oxide layer is disposed on an upper portion of the first fin type pattern and an upper portion of the second fin type pattern. A gate electrode is disposed on the gate oxide layer. The first fin type structure includes a first part of a first silicon germanium alloy (SiGe) layer and a silicon layer stacked on each other. A second fin type structure includes a second part of the first SiGe layer and a second SiGe layer stacked on each other. An atomic percent of germanium of the second SiGe layer is greater than an atomic percent of germanium of the first SiGe layer. The silicon layer does not include germanium. An upper surface of the silicon layer and an upper surface of the second SiGe layer are substantially coplanar.

BRIEF DESCRIPTION OF DRAWINGS

These and other features of the present inventive concept will become more apparent by describing in detail exemplary embodiments thereof with reference to the accompanying drawings of which.

Figure 1:
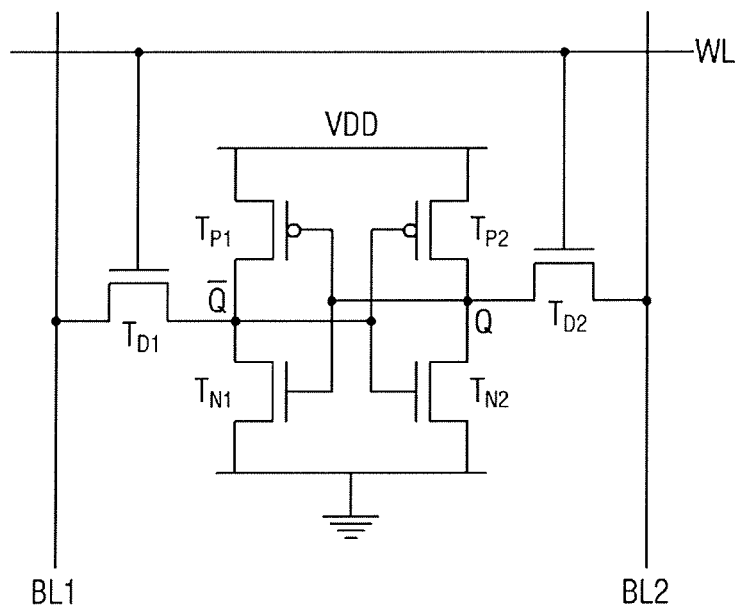
FIG. 1 is a circuit diagram of a unit memory cell of a static random access memory (SRAM) device according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present.

Figure 2:
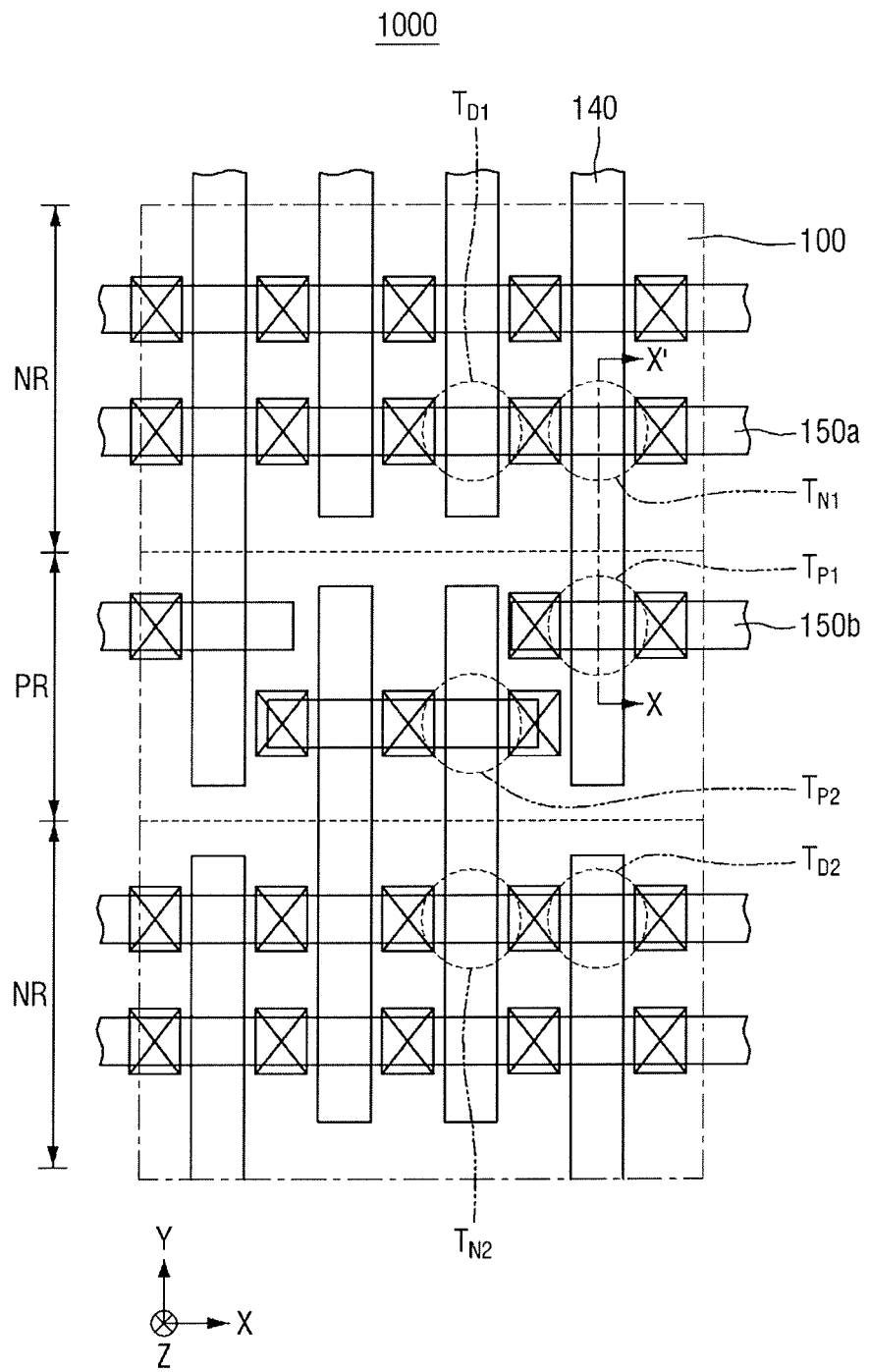
FIG. 2 is a layout of the memory cell of FIG. 1 according to an exemplary embodiment of the present inventive concept.
Figure 3:
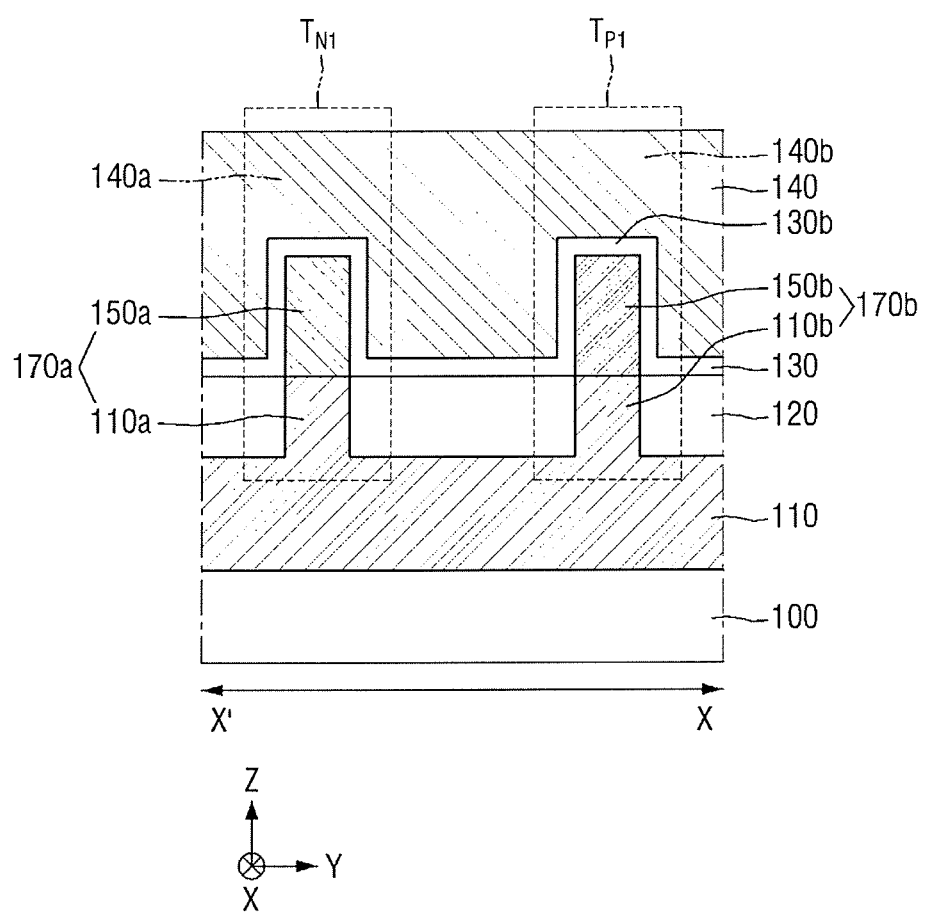
FIG. 3 is a cross-sectional view of FIG. 2 taken along line X-X' according to an exemplary embodiment of the present inventive concept.
Figure 4:
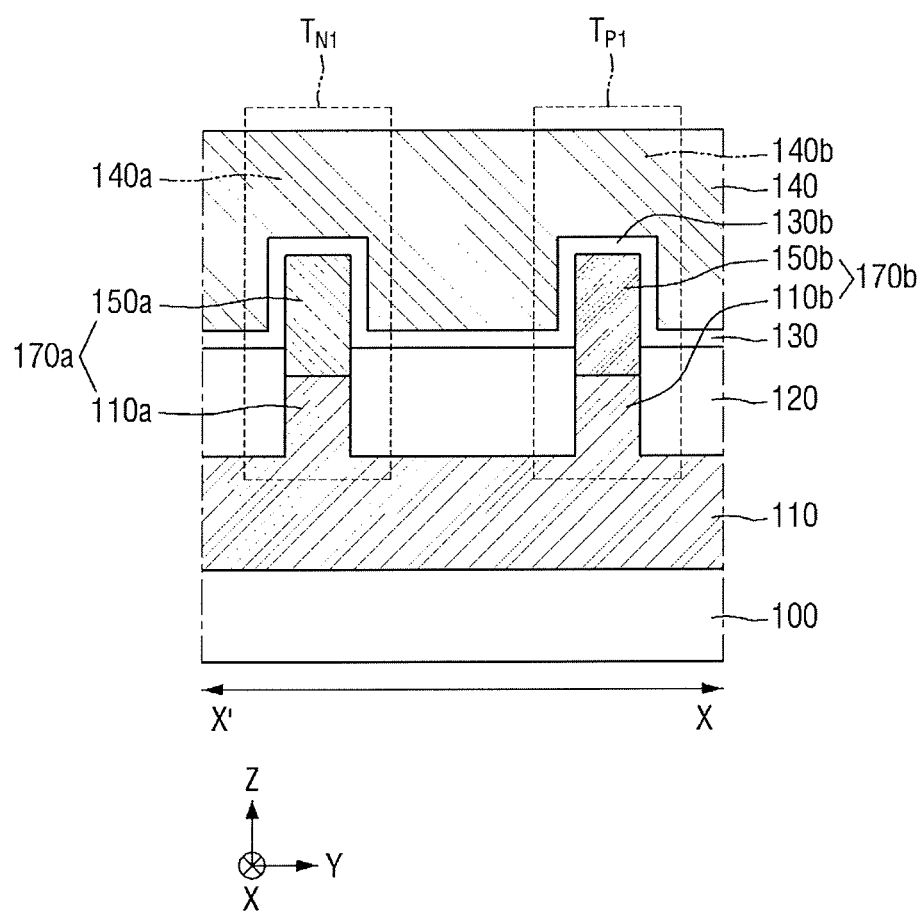
FIG. 4 is a cross-sectional view of FIG. 2 taken along line X-X' according to an exemplary embodiment of the present inventive concept.

FIG. 1 is a circuit diagram of a unit memory cell of a static random access memory (SRAM) device according to an exemplary embodiment of the present inventive concept. FIG. 2 is a layout of the memory cell of FIG. 1 according to an exemplary embodiment of the present inventive concept. FIG. 3 is a cross-sectional view of FIG. 2 taken along line X-X' according to an exemplary embodiment of the present inventive concept. FIG. 4 is a cross-sectional view of FIG. 2 taken along line X-X' according to an exemplary embodiment of the present inventive concept.

In FIG. 1, a unit memory cell 1000 of an SRAM device is formed of six transistors $T_{P1}$, $T_{P2}$, $T_{N1}$, $T_{N2}$, $T_{D1}$ and $T_{D2}$. The unit memory cell 1000 may store a data or provide a data stored according to a write or read operation. The unit memory cell 1000 may include NFETs $T_{D1}$, $T_{N1}$, $T_{D2}$, and $T_{N2}$, PFETs $T_{P1}$ and $T_{P2}$, bit lines BL1 and BL2, and a word line WL. "NFETs" is a plural form of "NFET", and "PFETs" is a plural form of "PFET". The bit lines BL1 and BL2 include a first bit line BL1 and a second bit line BL2. The word line WL is connected to gate electrodes of driving transistors $T_{D1}$ and $T_{D2}$ of the NFETs. The first bit line BL1 is connected to a terminal of a first driving transistor $T_{D1}$ of the NFETs. The second bit line BL2 is connected to a terminal of a second driving transistor $T_{D2}$. A first pair of NFET $T_{N1}$ and PFET $T_{P1}$ and a second pair of NFET $T_{N2}$ and PFET $T_{P2}$ is cross-coupled inverters to form a latch. The latch may hold or store data. The driving transistors $T_{D1}$ and $T_{D2}$ are access transistors to allow a current path to be formed between the bit lines BL1 and BL2 and the cross-coupled inverters formed of the transistors $T_{N1}$ and $T_{P1}$ and $T_{N2}$ and $T_{P2}$. The word line WL is a control signal line to switch the driving transistors $T_{D1}$ to $T_{D2}$.

In FIG. 2, the unit memory cell 1000 includes a substrate 100 having N-regions NR and a P-region PR. The NFETs $T_{D1}$, $T_{N1}$, $T_{D2}$, and $T_{N2}$ are formed in the N-regions NR, and the PFETs $T_{P1}$ and $T_{P2}$ are formed in the P-region PR. The NFETs $T_{D1}$, $T_{N1}$, $T_{D2}$, and $T_{N2}$ and the PFETs $T_{P1}$ and $T_{P2}$ include active fins 150a and 150b which extend in parallel to a first direction of an x-axis. A gate electrode 140 crosses the active fins 150a and 150b. The gate electrode 140 extends in parallel to a second direction of a y-axis which crosses the first direction. Sources/drains 114 may be formed in the substrate. The source/drains 114 may be adjacent to both sides of the gate electrode 140. In an exemplary embodiment, the source/drains 114 may be epitaxially formed, which may be referred to as an elevated source/drain. Source/drain contacts (not shown here) may be in contact with the source/drains 114 of the NFET $T_{N1}$ and PFET $T_{P1}$. The source/drain contacts may extend in parallel to a third direction of a z-axis. Hereinafter, the NFET $T_{N1}$ and the PFET $T_{P1}$ may be referred to as a first transistor $T_{N1}$ and a second transistor $T_{P1}$, respectively.

In FIG. 3, the first transistor $T_{N1}$ and the second transistor $T_{P1}$ of FIG. 1 are disposed on a strain relaxed buffer (SRB) layer 110. The first transistor $T_{N1}$ includes a first active fin 150a, a first gate oxide layer 130a, and a first gate electrode 140a to form an NFET. The second transistor $T_{P1}$ includes a second active fin 150b, a second gate oxide layer 130b and a second gate electrode 140b to form a PFET. The transistors $T_{N1}$ and $T_{P1}$ are connected to each other through a gate electrode 140 to form a complementary metal-oxide-semiconductor (CMOS) inverter. The gate electrode 140 includes the first gate electrode 140a and the second gate electrode 140b.

The SRB layer 110 may be epitaxially formed on a substrate 100. The SRB layer 110 includes a first part 110a and a second part 110b protruded in parallel to the third direction (z-axis) from an upper surface of the SRB layer 110. The SRB layer 110 may be formed of a first silicon germanium alloy ($Si_xGe_y$) epitaxially grown from the substrate 110. The SRB layer 110 may also be referred to as a first SiGe layer. For example, the sum of "x" and "y" is equal to 1, and "x" is about 0.75 and "y" is about 0.25. The present inventive concept is not limited thereto. The method of forming the first part 110a and the second part 110b will be described later.

The first active fin 150a and the second active fin 150b are disposed on the SRB layer 110. For example, the first active fin 150a is disposed on an upper surface of the first part 110a of the SRB layer 110. The second active fin 150b is disposed on an upper surface of the second part 110b of the SRB layer 110. The combined structure of the first active fin 150a and the first part 110a may be referred to as a first fin type structure 170a. The combined structure of the second active fin 150b and the second part 110b may be referred to as a second fin type structure 170b.

The first active fin 150a may be formed of silicon (Si) and may be epitaxially grown from the SRB layer 110. The present inventive concept is not limited thereto. For example, the first active fin 150a may be formed of silicon carbide alloy (SiC).

The lattice parameter of the SRB layer 110 may be greater than the lattice parameter of the first active fin 150a. The lattice mismatch between the SRB layer 110 and the first active fin 150a may cause to apply a tensile stress to the first active fin 150a.

If the first transistor $T_{N1}$ is turned on, a channel region is formed in the first active fin 150a so that current flows through the channel region in parallel to the first direction (x-axis) which is perpendicular to the cross-section shown in FIG. 3. The tensile stress applied to the first active fin 150a may increase mobility of carriers (for example, electrons) of the first transistor $T_{N1}$.

The second active fin 150b may be formed of second silicon germanium alloy ($Si_kGe_m$) epitaxially grown from the SRB layer 110. The second silicon germanium alloy ($Si_kGe_m$) of the second active fin 150b is different from the first silicon germanium alloy ($Si_xGe_y$) of the SRB layer 110. For example, k+m is equal to 1, and k is about 0.5 and m is about 0.5. In this case, the lattice parameter of the second silicon germanium alloy ($Si_kGe_m$) is greater than the lattice parameter of the first silicon germanium alloy ($Si_xGe_y$). The lattice mismatch between the second active fin 150b and the SRB layer 110 may cause to apply a compressive stress to the second active fin 150b.

If the second transistor $T_{P1}$ is turned on, a channel region is formed in the second transistor $T_{P1}$ so that current flows through the channel region in parallel to the first direction (x-axis) which is perpendicular to the cross section shown in FIG. 3. The compressive stress applied to the second active fin 150b may increase mobility of carriers (for example, holes) of the second transistor $T_{P1}$.

An insulating layer 120 is disposed between the first fin type structure 170a and the second fin type structure 170b. The insulating layer 120 fills a space between the first fin type structure 170a and the second fin type structure 170b. The insulating layer 120 may be formed of silicon oxide, for example. An upper surface of the insulating layer 120 is substantially coplanar with the upper surfaces of the first and the second parts 110a and 110b of the SRB layer 110. For example, the upper surface of the insulating layer 120 is substantially coplanar with a boundary between the first part 110a and the first active fin 150a and a boundary between the second part 110b and the second active fin 150b.

The present inventive concept is not limited thereto. For example, the upper surface of the insulating layer 120 may be higher than the upper surfaces of the first and the second parts 110a and 110b, as shown in FIG. 4. In FIG. 4, the transistors $T_{N1}$ and $T_{P1}$ of FIG. 4 are substantially the same as those of FIG. 3, except that the insulating layer 120 of FIG. 4 has an upper surface higher than the upper surfaces of the first part 110a and the second part 110b.

Referring back to FIG. 3, a first gate oxide layer 130a is interposed between the first active fin 150a and a first gate electrode 140a. The stacked structure of the first active fin 150a, the first gate oxide layer 130a and the first gate electrode 140a may constitute the first transistor $T_{N1}$ with source/drains (not shown here). If the first transistor $T_{N1}$ is turned on, an N-type channel may be formed in the first active fin 150a along a boundary between the first gate oxide layer 130a and the first active fin 150a and current flows through the N-type channel. In the N-type channel, electrons (majority carriers of the current flow) may have increased mobility due to the tensile stress as discussed above. The boundary between the first gate oxide layer 130a and the first active fin 150a may correspond to a width of the N-type channel formed in the first active fin 150a. Since the sidewall region of the first active fin 150a is provided as part of the N-type channel, the current driving capability of the first transistor $T_{N1}$ may increase without increasing the planar size of the first transistor $T_{N1}$ and thus more transistors may be fabricated per a unit area, compared with a planar transistor.

A second gate oxide layer 130b is interposed between the second active fin 150b and a second gate electrode 140b. The stacked structure of the second active fin 150b, the second gate oxide layer 130b and the second gate electrode 140b may constitute the second transistor $T_{P1}$ with source/drains (not shown here). If the first transistor $T_{P1}$ is turned on, a P-type channel may be formed in the second active fin 150b along a boundary between the second gate oxide layer 130b and the second active fin 150b. In the P-type channel, holes, majority carriers of the current flow, may have increased mobility due to the compressive stress discussed above.

The boundary between the second gate oxide layer 130b and the second active fin 150b may correspond to a width of the P-type channel formed in the second active fin 150b. Since the sidewall region of the second active fin 150b is provided as part of the P-type channel, the current driving capability of the second transistor $T_{P1}$ may increase without increasing the planar size of the second transistor $T_{P1}$ and thus more transistors may be fabricated per a unit area, compared with a planar transistor.

The first gate oxide layer 130a and the second gate oxide layer 130b are part of an oxide layer 130. An overlapped part of the oxide layer 130 with the first active fin 150a corresponds to the first gate oxide layer 130a. Similarly, an overlapped part of the oxide layer 130 with the second active fin 150b corresponds to the second gate oxide layer 130b.

The first gate electrode 140a and the second gate electrode 140b are part of the gate electrode 140 which is electrically conductive. The gate electrode 140 may be formed of doped silicon, metal or a stacked structure thereof. Referring back to FIGS. 1 and 2, the gate electrode 140 is commonly connected to the first transistor $T_{P1}$ and the second transistor $T_{N1}$, providing the first gate electrode 140a to the first transistor TR1 and the second gate electrode 140b to the second transistor TR2.

According to an exemplary embodiment, the oxide layer 130 is in contact with only an uppermost layer of a fin type structure so that different materials of the fin type structure do not serve as a channel region. For example, as shown in FIGS. 3 and 4, the first active fin 150a alone is in contact with the first gate oxide layer 130a so that the N-type channel is formed in the first active fin 150a only; the second active fin 150b alone is in contact with the second gate oxide layer 130b so that the P-type channel is formed in the second active fin 150b only.

According to an exemplary embodiment, a boundary between the first active fin 150a and the first part 110a of the SRB layer 110 is substantially coplanar with a boundary between the second active fin 150b and the second part 110b of the SRB layer 110.

According to an exemplary embodiment, an SRAM may include an NFET having the first fin type structure 170a and a PFET having the second fin type structure 170b, where the first fin type structure 170a and the second fin type structure 170b are formed of different materials from each other. For example, the first fin type structure 170a includes the first active fin 150a formed of silicon, and the second fin type structure 170b includes the second active fin 150b formed of the second silicon germanium alloy ($Si_mGe_k$).

Figure 5:
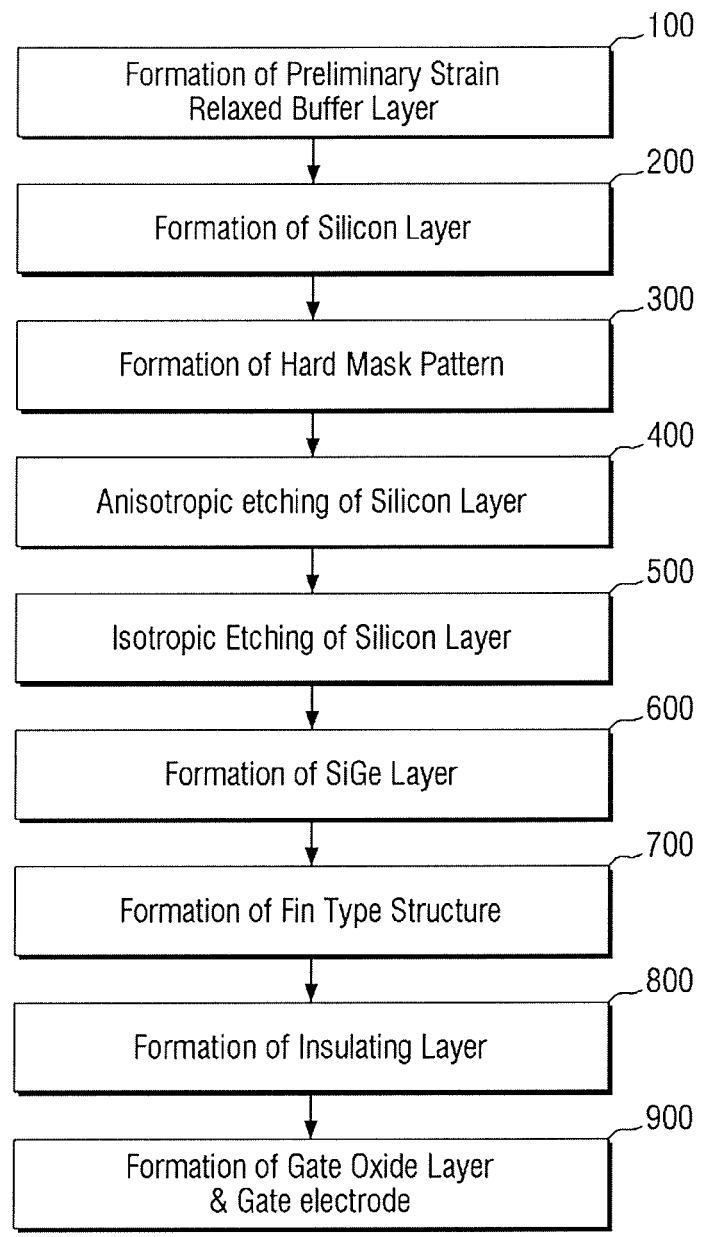
FIG. 5 shows a flowchart of fabricating the transistors of FIG. 3 according to an exemplary embodiment of the present inventive concept.

Hereinafter, a fabrication process of the transistors of FIG. 3 will be described with reference to FIG. 5 to FIG. 14. FIG. 5 shows a flowchart of fabricating the transistors of FIG. 3 according to an exemplary embodiment of the present inventive concept. FIGS. 6-14 show vertical cross-sectional views of the transistors fabricated according to the flowchart of FIG. 5.

Figure 6:
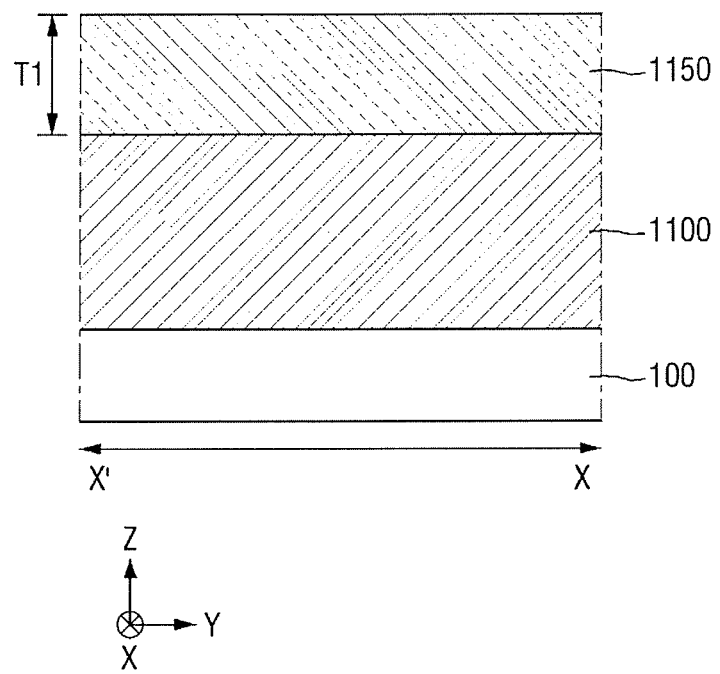
FIGS. 6-14 show vertical cross-sectional views of the transistors fabricated according to the flowchart of FIG. 5.

In FIG. 6, a resulting structure formed after completing steps 100 and 200 in the flowchart of FIG. 5 is shown. A preliminary strain relaxed buffer (preliminary SRB) layer 1100 and a silicon layer 1150 are formed on a substrate 100.

In step 100, the preliminary SRB layer 1100 is first formed on the substrate 100. In step 200, the silicon layer 1150 is formed on the preliminary SRB layer 1100. The preliminary SRB layer 1100 may be epitaxially formed using the substrate 100 as a seed layer. The preliminary SRB layer 1100 may be foil led of a first silicon germanium alloy ($Si_xGe_y$) epitaxially grown from the substrate 100. For example, the sum of "x" and "y" is equal to 1, and "x" is about 0.75 and "y" is about 0.25. The method of forming the first part 110a and the second part 110b will be described later.

In an exemplary embodiment, a seed layer may be formed on the substrate 100 before the step 100 is performed, and then the preliminary SRB layer 1100 is epitaxially formed on the seed layer.

In step 200, the silicon layer 1150 is formed on the preliminary SRB layer 1100. The silicon layer 1150 may be epitaxially formed on the preliminary SRB layer 1100. The silicon layer may have a first thickness T1.

Figure 7:
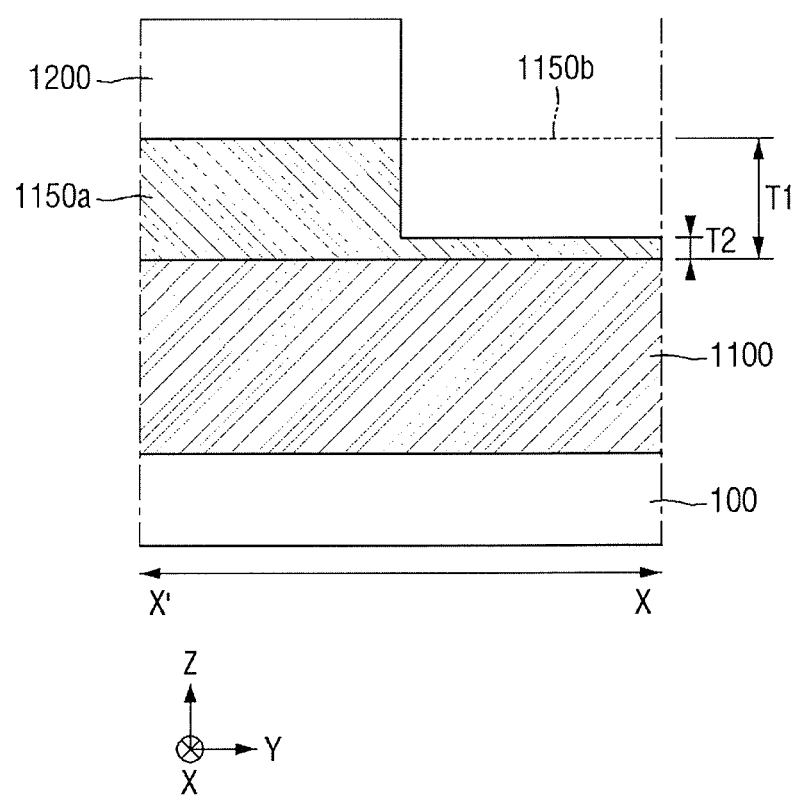

In FIG. 7, a resulting structure formed after completing steps 300 and 400 of FIG. 5 is shown.

In step 300, a hard mask pattern 1200 is formed on the resulting structure of the FIG. 6. For example, the hard mask pattern 1200 is formed on the silicon layer 1150. The hard mask pattern 1200 covers a first region 1150a of the silicon layer 1150, exposing a second region 1150b. The dashed line may indicates to the second region 1150 before step 400 is performed.

In step 400, an anisotropic etching process is performed on the silicon layer 1150 using the hard mask pattern 1200 as an etch mask. The first region 1150a underneath the hard mask pattern 1200 may be protected from the anisotropic etching process. The second region 1150b of the silicon layer 1150 is partially etched such that the second region 1150b of the silicon layer 1150 has a second thickness T2 smaller than the first thickness T1. After completing the step 400, the preliminary SRB layer 1100 remains covered with the silicon layer 1150 of which the first region 1150a has the first thickness T1 and of which the second region 1150b has the second thickness T2. For example, the second region 1150b of the silicon layer 1150 need not be completely etched, and thus an upper surface of the preliminary SRB layer 1100 is not exposed.

In an exemplary embodiment, the anisotropic etching process may include a reactive ion etching (RIE) process, for example. The RIE process may be controlled such that an undercut of the first region 1150a under the hard mask pattern 1200 is minimized. More directional the anisotropic etching process, the less the undercut of the first region 1150a. The anisotropic etching process may be further controlled such that the second region 1150b of the silicon layer 1150 has the second thickness T2, and thus the preliminary SRB layer 1100 may be protected from the anisotropic etching process.

During the anisotropic etching process, fluorine-based gases (e.g., CF4 or CHF3 gas) or argon (Ar) gases may be used as etchant gases. In an exemplary embodiment, a bias voltage may be applied to the rear surface of the substrate 100 to cause active etchant gases to more directionally travel to the substrate 100 along an electric field formed by the bias voltage. As the result, the gases injected into a process chamber may be accelerated toward the substrate 100 to partially remove the second region 1150b of the silicon layer 1150.

Figure 8:
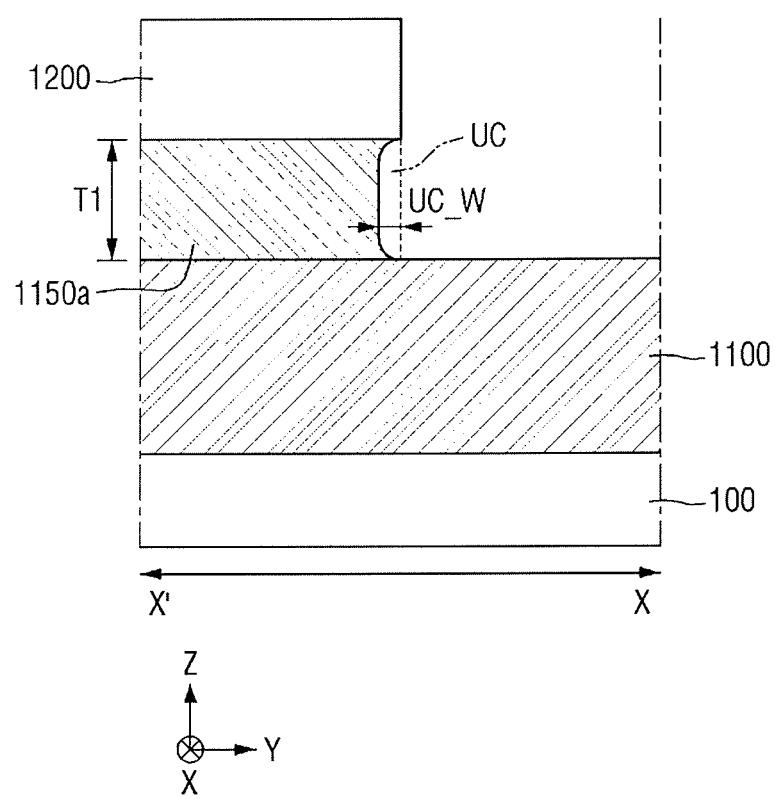

In FIG. 8, a resulting structure formed after completing step 500 of FIG. 5 is shown.

In step 500, a wet etching process is applied to the resulting structure of FIG. 7 to completely remove the second region 1150b which remains after performing the anisotropic etching process. The wet etching process may be performed until an upper surface of the preliminary SRB layer 1100 under the second region 1150b is exposed. In the wet etching process, the silicon layer 1150 of FIG. 7 is selectively etched with respect to the preliminary SRB layer 1100 and is isotropically etched. In this case, an undercut UC under the hard mask pattern 1200 is formed to have an undercut width UC_W in the first region 1150a of the silicon layer 1150. The size of the undercut width UC_W of the undercut UC may depend on the second thickness T2 of the second region 1150b of the silicon layer 1150. For example, the greater the second thickness T2, the greater the undercut width UC_W. The undercut width UC_W may be controlled such that the first transistor $T_{N1}$ of FIG. 3 has an allowable width of the N-type channel.

In an exemplary embodiment, the wet etching process may be further performed for a predetermined time after the upper surface of the preliminary SRB layer 1100 is exposed. In this case, overetching of the preliminary SRB layer 1100 may be minimized so that an upper surface of the preliminary SRB layer 1100 is substantially even.

In an exemplary embodiment, the wet etching process may be performed using a chemical etchant including SC1, $NH_4OH$, KOH, or TMAH, but the present inventive concept is not limited thereto.

The present inventive concept is not limited to the wet etching process. For example, a plasma etching process having isotropic etching characteristics may be applied to remove the second region 1150b of the silicon layer 1150 without overetching of the preliminary SRB layer 1100 or minimizing overetching of the preliminary SRB layer 1100.

The plasma etching process may be performed using at least one of fluorine (F), chlorine (Cl), and bromine (Br).

For example, $CF_4$ gas or $CHF_3$ gas may be used as an etchant gas in the plasma etching process. Since the plasma etching process is performed without applying a bias voltage to a rear surface of the substrate 100, the gas injected into a process chamber is not directional so that an isotropic etching profile may be obtained.

Figure 9:
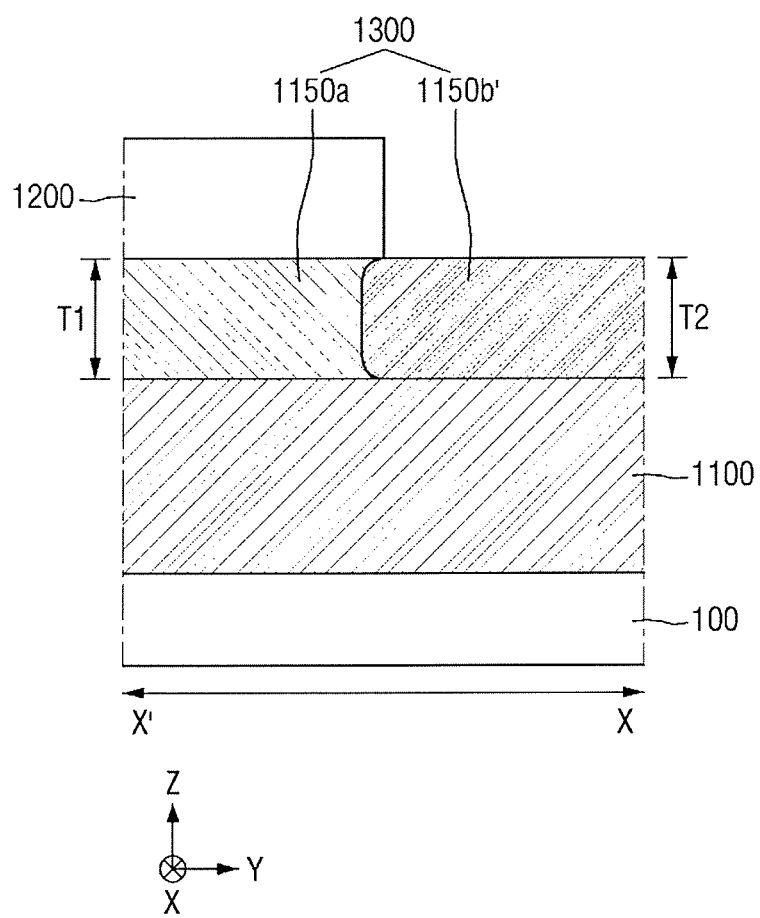

In FIG. 9, a resulting structure formed after completing step 600 of FIG. 5 is shown.

In step 600, a SiGe layer 1150b' is epitaxially formed on the exposed upper surface of the preliminary SRB layer 1100. The SiGe layer 1150' may also be referred to as a second SiGe layer. The SiGe layer 1150b' may be formed of a second silicon germanium alloy ($Si_kGe_m$) epitaxially grown. For example, the sum of "k" and "m" is equal to 1, and k is about 0.5 and m is about 0.5. The SiGe layer 1150b' may have a different composition from the preliminary SRB layer 1100. For example, the amount of germanium (Ge) in the SiGe layer 1150b' is greater than the amount of germanium (Ge) in the preliminary SRB layer 1100, and the lattice parameter of the SiGe layer 1150b' may be greater than the lattice parameter of the preliminary SRB layer 1100.

The formation of the SiGe layer 1150b' may be controlled such that the SiGe layer 1150b' has a second thickness T2 and an upper surface of the SiGe layer 1150b' may be substantially coplanar with the upper surface of the first region 1150a of the silicon layer. Since the SiGe layer 1150b' is formed on the preliminary SRB layer 1100 which is not overetched or scarcely overetched in the steps 400 and 500, the second thickness T2 of the SiGe layer 1150b' is substantially the same with the first thickness T1 of the first region 1150a of the silicon layer and a lower surface of the SiGe layer 1150b' may be substantially coplanar with a lower surface of the first region 1150a of the silicon layer. In an exemplary embodiment, the first region 1150a of the silicon layer and the SiGe layer 1150b' may be referred to as a heterogeneous channel layer 1300.

In an exemplary embodiment, the heterogeneous channel layer 1300 may have a uniform thickness, and thus may be subject to an etching process at the same time to form a fin type structure for NFETs and a fin type structure for PFETs.

Figure 10:
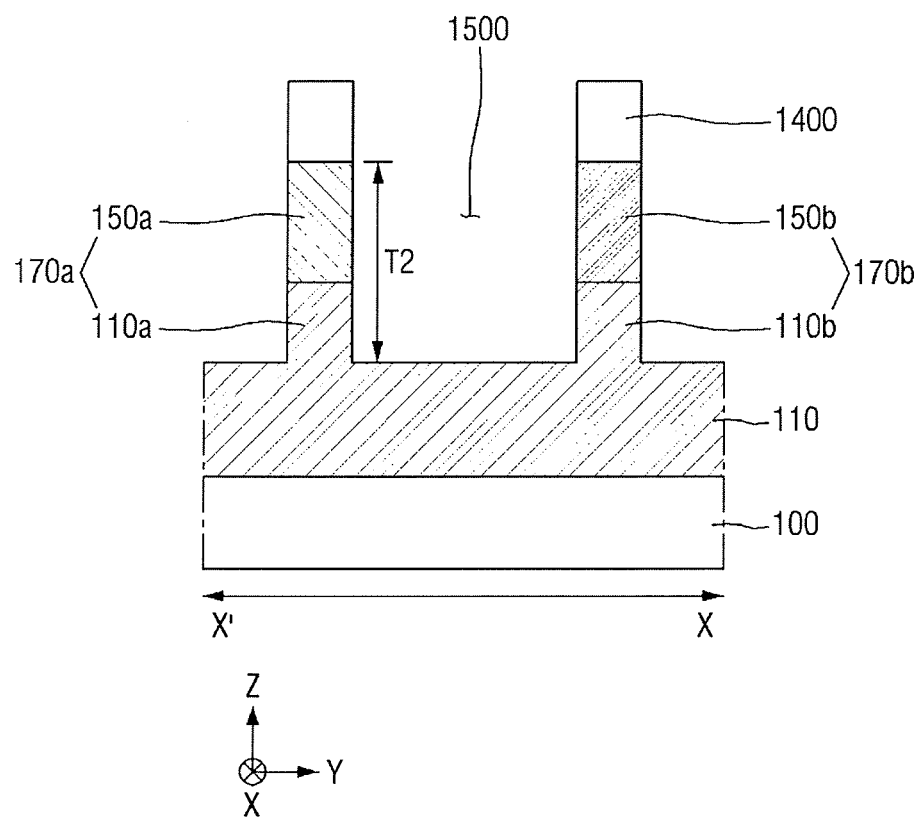

In FIG. 10, the fin type structures 170a and 170b of FIG. 3 are formed after completing step 700 of FIG. 5.

In step 700, the fin type structures 170a and 170b of FIG. 3 are formed. Before performing the step 700, the hard mask pattern 1200 may be removed and a photoresist layer (not shown here) may be formed on the heterogeneous channel layer 1300. The photoresist layer may be patterned to form mask patterns 1400 to form the fin type structures 170a and 170b. With an etching process using the mask patterns 1400 as an etch mask, the heterogeneous channel layer 1300 of FIG. 9 may be simultaneously patterned to form the fin type structures 170a and 170b. The present inventive concept is not limited thereto, and the etch mask may be formed of various materials resistant to etchants of the etching process. For example, the mask patterns 1400 may be formed of a material having etching selectivity with respect to the heterogeneous channel layer 1300 and the preliminary SRB layer 1100. For example, the material of the mask patterns 1400 may include amorphous silicon (a-Si), titanium (Ti), titanium nitride (TiN), tantalum nitride (TaN), silicon oxide (SiO2), or silicon oxynitride (SiON).

In the etching process of step 700, the heterogeneous channel layer 1300 may be patterned to the first active fin 150a and the second active fin 150b, and the preliminary SRB layer 1100 may be partially etched to form the first part 110a and the second part 110b. In an exemplary, the etching of the heterogeneous channel layer 1300 and the etching of the preliminary SRB layer 1100 may be performed continuously without changing a process condition of the etching process. For example, a trench 1500 may be formed between the fin type structures 170a and 170b. The trench 1500 penetrates through the heterogeneous channel layer 1300 and extends to a first depth D1 into the preliminary SRB layer 1100. The first depth D1 is measured downwardly from an upper surface of the first active fin 150a. The resulting structure of the preliminary SRB layer 1100 after completing step 700 corresponds to the SRB layer 110 of FIG. 3. The SRB layer 110 has the first and the second parts 110a and 110b.

Figure 11:
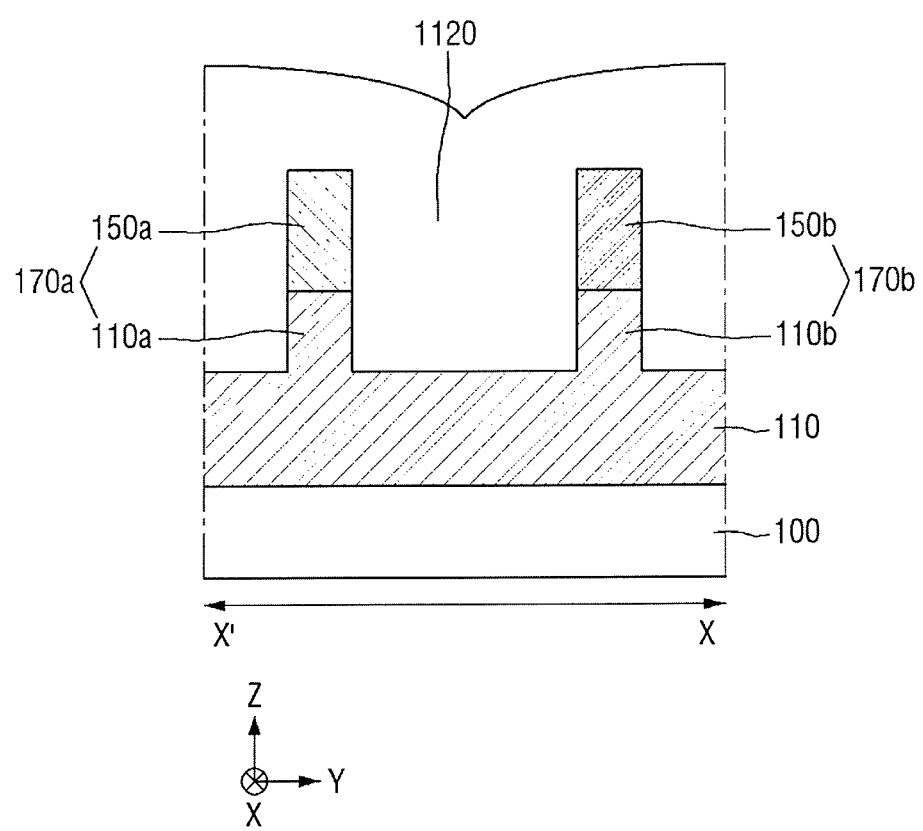
Figure 12:
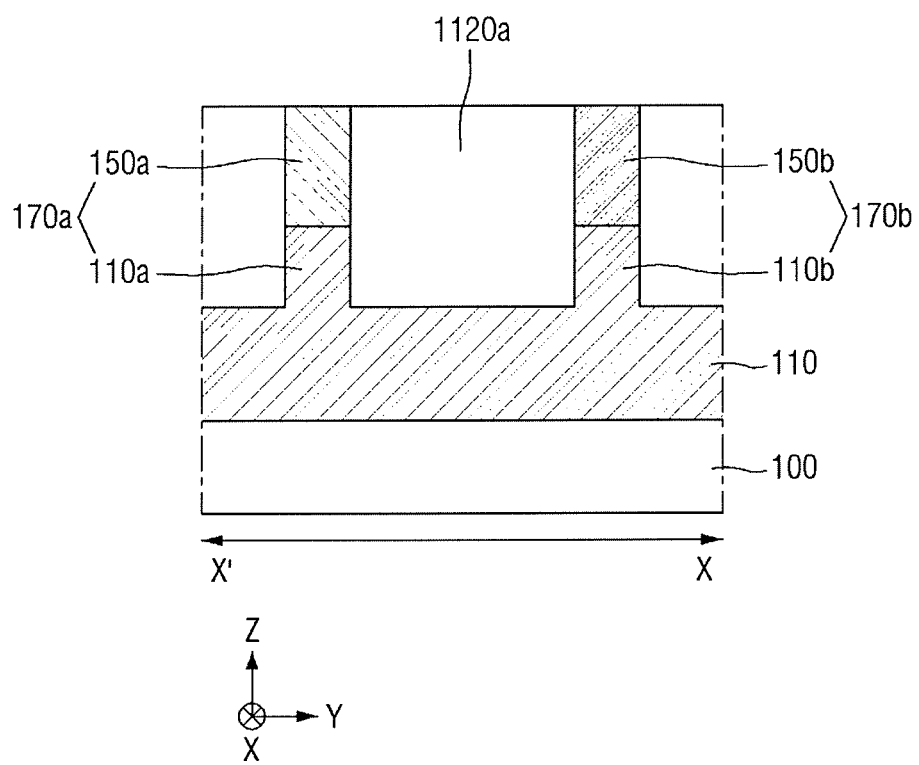

In step 800, a preliminary insulating layer 1120 is formed on the resulting structure of step 700. The mask patterns 1400 may be removed before the formation of the preliminary insulating layer 1120. The preliminary insulating layer 1120 completely fills the trench 1500, covering the fin type structures 170a and 170b as shown in FIG. 11. The preliminary insulating layer 1120 is planarized until upper surfaces of the fin type structures 170a and 170b are exposed. The upper surfaces of the fin type structures 170a and 170b are substantially coplanar with an upper surface of a planarized preliminary insulating layer 1120a as shown in FIG. 12. The planarized preliminary insulating layer 1120a is further etched down to a predetermined depth D2 so that the insulating layer 120 of FIG. 3 is formed. The predetermined depth D2 is measured downwardly from the upper surface of the first active fin 150a. In this case, the upper surface of the insulating layer 120 may be coplanar with the boundary between the first active fin 150a and the first part 110a, and may be coplanar with the boundary between the second active fin 150b and the second part 110b. In an exemplary embodiment, the planarized preliminary insulating layer 1120a of FIG. 12 may be further etched down to a depth less than the predetermined depth D2 to form the insulating layer 120 of FIG. 4 in which the upper surface of the insulating layer 120 is higher than the boundary between the first active fin 150a and the first part 110a. The upper surface of the insulating layer 120 is also higher than the boundary between the second active fin 150b and the second part 110b.

Figure 13:
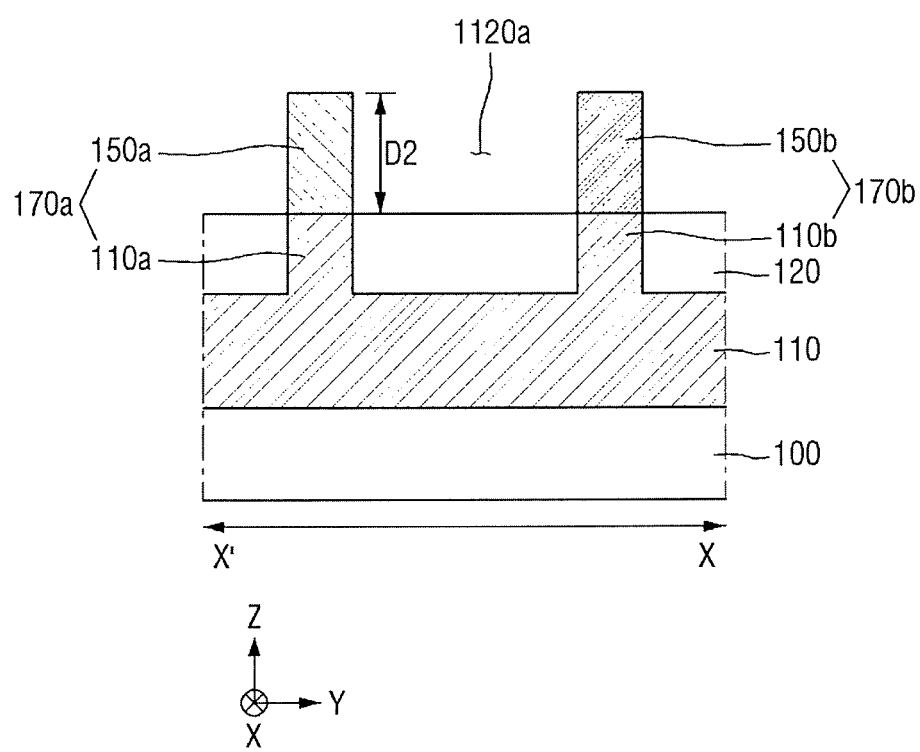
Figure 14:
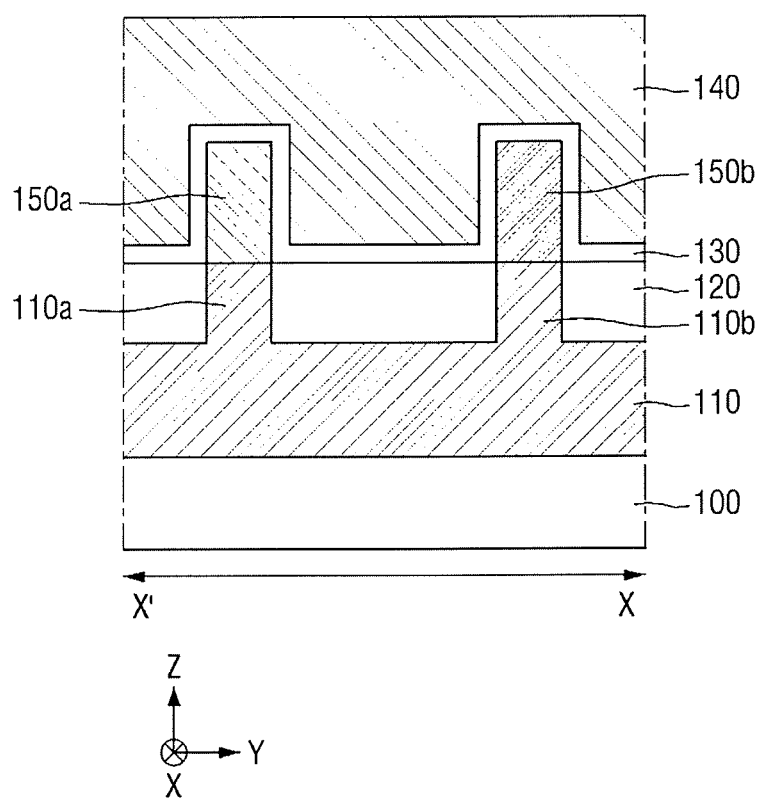

In FIG. 14, the gate oxide layer 130 and the gate electrode 140 of FIG. 3 are formed on the resulting structure of FIG. 13. In step 900, the gate oxide layer 130 may be conformally formed on the fin type structures 170a and 170b. For example, the gate oxide layer 130 is formed on a surface of the first active fin 150a exposed by the insulating layer 120 and on a surface of the second active fin 150b exposed by the insulating layer 120. After formation of the gate oxide layer 130, the gate electrode 140 is formed on the gate oxide layer 130. In an exemplary embodiment, the gate electrode 140 is in contact with an upper surface of the gate oxide layer 130.

The gate oxide layer 130 may be formed of silicon oxide or a high-k dielectric material. The high-k dielectric material has a dielectric constant greater than a dielectric constant of silicon oxide. The high-k dielectric material may include hafnium oxide ($HfO_2$), aluminum oxide ($Al_2O_3$), zirconium oxide ($ZrO_2$), or tantalum oxide ($Ta_2O_5$). The gate electrode 140 may be formed of a conductive material including a doped silicon or metal. The conductive material of metal may include tungsten (W) or aluminum (Al). In case where metal is used for the gate electrode 140, the high-k dielectric material may be used as the gate oxide layer 130.

Figure 15:
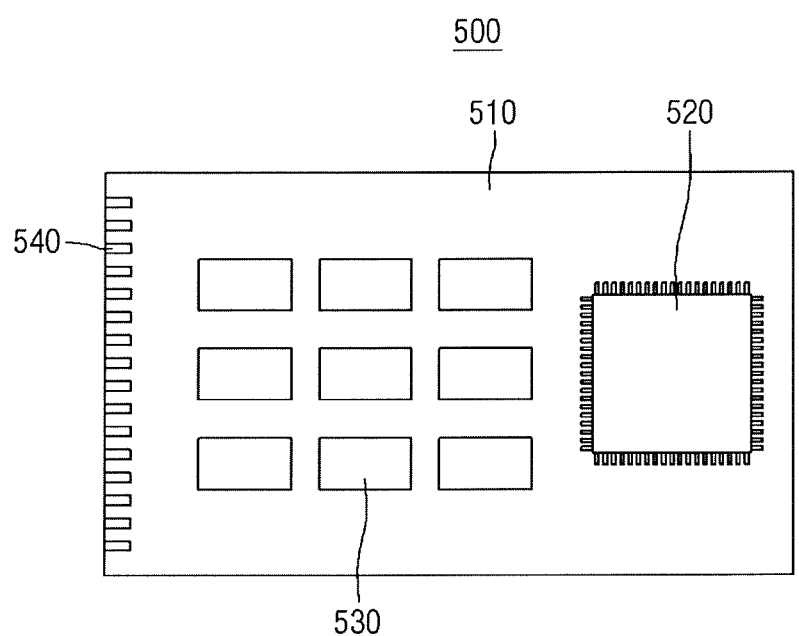
FIG. 15 is a semiconductor module having a semiconductor device fabricated according to an exemplary embodiment of the present inventive concept.

FIG. 15 is a semiconductor module having a semiconductor device fabricated according to an exemplary embodiment of the present inventive concept.

Referring to FIG. 15, the semiconductor module 500 includes a semiconductor device 530. The semiconductor device 530 may be formed according to an exemplary embodiment of the present inventive concept. The semiconductor device 530 is mounted on a semiconductor module substrate 510. The semiconductor module 500 further includes a microprocessor 520 mounted on the semiconductor module substrate 510. Input/output terminals 540 are disposed on at least one side of the semiconductor module substrate 510. The semiconductor module 500 may be included in a memory card or a solid state drive (SSD).

Figure 16:
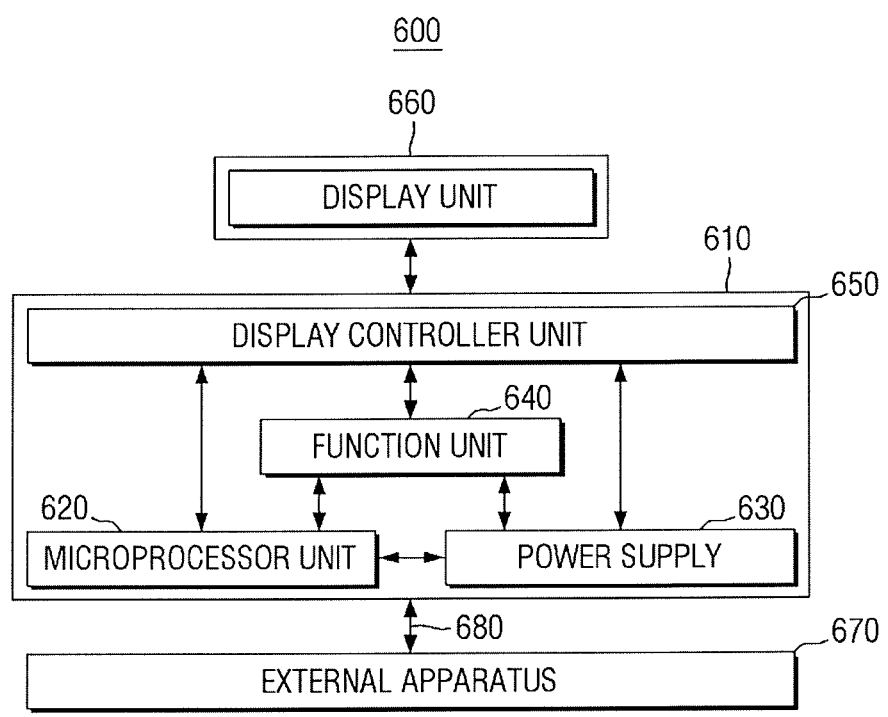
FIG. 16 is a block diagram of an electronic system having a semiconductor device according to an exemplary embodiment of the present inventive concept.

FIG. 16 is a block diagram of an electronic system having a semiconductor device according to an exemplary embodiment of the present inventive concept.

Referring to FIG. 16, a semiconductor device fabricated according to an exemplary embodiment of the present inventive concept may be included in an electronic system 600. The electronic system 600 includes a body 610, a microprocessor unit 620, a power supply 630, a function unit 640, and a display controller unit 650. The body 610 may include a system board or a motherboard having a printed circuit board (PCB) or the like. The microprocessor unit 620, the power supply 630, the function unit 640, and the display controller unit 650 is mounted or disposed on the body 610. A display unit 660 may be stacked on an upper surface of the body 610. For example, the display unit 660 is disposed on a surface of the body 610, displaying an image processed by the display controller unit 650. The power supply 630 receives a constant voltage from an external power supply, generating various voltage levels to supply the voltages to the microprocessor unit 620, the function unit 640, the display controller unit 650, etc. The microprocessor unit 620 receives a voltage from the power supply 630 to control the function unit 640 and the display unit 660. The function unit 640 may perform various functions of the electronic system 600. For example, when the electronic system 600 is a mobile electronic product such as a cellular phone, or the like, the function unit 640 may include various components to perform wireless communication functions such as dialing, video output to the display unit 660 or voice output to a speaker through communication with an external device 670, and when a camera is included, it may serve as an image processor. In an exemplary embodiment, if the electronic system 600 is connected to a memory card to expand the storage capacity, the function unit 640 may serve as a memory card controller. The function unit 640 may exchange signals with the external device 670 through a wired or wireless communication unit 680. Further, when the electronic system 600 requires a Universal Serial Bus (USB) to extend the functions, the function unit 640 may serve as an interface controller. The function unit 640 may include a semiconductor device fabricated according to an exemplary embodiment of the present inventive concept.

Figure 17:
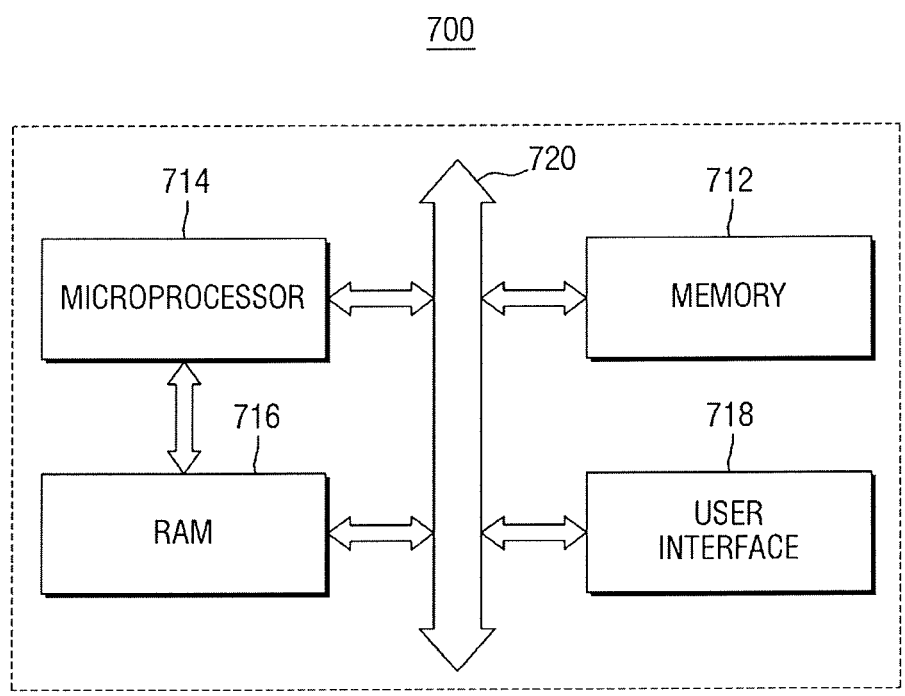
FIG. 17 is a block diagram of an electronic system having a semiconductor device fabricated according to an exemplary embodiment of the present inventive concept.

FIG. 17 is a block diagram of an electronic system having a semiconductor device fabricated according to an exemplary embodiment of the present inventive concept.

Referring to FIG. 17, the electronic system 700 may be included in a mobile device or a computer. For example, the electronic system 700 includes a memory system 712, a microprocessor 714, a random access memory (RAM) 716, and a user interface 718 configured to perform data communication using a bus 720. The microprocessor 714 may program and control the electronic system 700. The RAM 716 may be used as an operational memory of the microprocessor 714. For example, the microprocessor 714 or the RAM 716 may include a semiconductor device fabricated according an exemplary embodiment of the present inventive concept.

The microprocessor 714, the RAM 716, and/or other components may be assembled within a single package. The user interface 718 may be used to input or output data to or from the electronic system 700. The memory system 712 may store operational codes of the microprocessor 714, data processed by the microprocessor 714, or data received from the outside. The memory system 712 may include a controller and a memory.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, comprising:
   forming a strain relaxed buffer (SRB) layer on a substrate, the SRB layer being formed of a first silicon germanium alloy which has a first atomic percent of germanium (Ge) atoms; and
   forming a heterogeneous channel layer on the SRB layer, the heterogeneous channel layer including a silicon layer on a first region of the SRB layer and a second SiGe layer on the second of the SRB layer,
   wherein the second SiGe layer is formed of a second silicon germanium alloy,
   wherein the second SiGe layer includes a second atomic percent of germanium atoms greater than the first atomic percent of germanium atoms, and
   wherein the silicon layer is in contact with the second SiGe layer,
   wherein forming the heterogeneous channel layer includes:
   forming a preliminary silicon layer having a first thickness on the SRB layer;
   removing partially the preliminary silicon layer using at least two etching processes to form the silicon layer, wherein the silicon layer covers the first region of the SRB layer, and
   wherein the silicon layer exposes a second region of the SRB layer to provide an exposed second region of the SRB layer; and
   forming the second SiGe layer having a second thickness on the exposed second region of the SRB layer so that the second SiGe layer is in contact with the silicon layer, wherein the second thickness and the first thickness are substantially the same.

2. The method of claim 1, wherein the silicon layer does not include germanium atoms.

3. The method of claim 2, wherein the first atomic percent of germanium atoms is such that a tensile stress is applied to the silicon layer of the heterogeneous channel layer.

4. The method of claim 2, wherein the first atomic percent of germanium atoms and the second atomic percent of germanium atoms are such that a compressive stress is applied to the second SiGe layer.

5. The method of claim 1, wherein the forming of the second SiGe layer is controlled so that an upper surface of the second SiGe layer is substantially coplanar with an upper surface of the silicon layer.

6. The method of claim 1, wherein the at least two etching process includes an anisotropic etching process and an isotropic etching process.

7. The method of claim 1, wherein the removing partially of the silicon layer includes:
   removing partially a portion of the preliminary silicon layer covering the second region of the SRB layer so that the portion of the preliminary silicon has a second thickness less than the first thickness; and
   removing completely the portion of the preliminary silicon layer having the second thickness using an isotropic etching process so that the second region of the SRB layer is exposed.

8. The method of claim 7, wherein the isotropic etching process is performed using a wet etching process using an etchant including tetramethyammonium hydroxide.

9. The method of claim 7, wherein the isotropic etching process is performed using a plasma etching processing using an etchant gas including at least one of fluorine (F), chlorine (Cl) and bromine (Br).

10. The method of claim 1, wherein the first atomic percent is about 25 atomic percent and the second atomic percent is about 50 atomic percent.

11. A method of fabricating a semiconductor device, comprising:
    forming a first silicon germanium alloy (SiGe) layer on a substrate;
    forming a heterogeneous channel layer on the first SiGe layer, the heterogeneous channel layer including a silicon layer on a first region of the first SiGe layer and a second SiGe layer on a second region of the first SiGe layer, wherein a germanium atomic percent of the second SiGe layer is greater than a germanium atomic percent of the first SiGe layer;
    forming a first fin type structure by patterning the silicon layer to a patterned silicon layer, the first fin type structure including the patterned silicon layer;
    forming a second fin type structure by patterning the second SiGe layer to a patterned second SiGe layer, the second fin type structure including the patterned second SiGe layer spaced apart from the patterned silicon layer;
    forming a gate oxide layer on the patterned silicon layer and the patterned second SiGe layer; and
    forming a gate electrode on the gate oxide layer, wherein the forming of the heterogeneous channel layer includes:
    forming a preliminary silicon layer on the first and the second regions of the first SiGe layer;

removing partially the preliminary silicon layer using at least two etching processes to form the silicon layer, wherein the silicon layer covers the first region of the first SiGe layer, and wherein the silicon layer exposes the second region of the first SiGe layer to provide an exposed second region of the first SiGe layer; and forming the second SiGe layer on the exposed second region of the first SiGe layer so that the second SiGe layer is in contact with the silicon layer.

12. The method of claim 11, wherein the forming of the first fin type structure and the forming of the second fin type structure are simultaneously performed.

13. The method of claim 11, wherein the forming of the first fin type structure further includes:

partially etching the first region of the first SiGe layer to form a first part of the first SiGe layer under the patterned silicon layer, wherein the first fin type structure further includes the first part of the first SiGe layer, and wherein forming the second fin type structure further includes:

partially etching the second region of the first SiGe layer to form a second part of the first SiGe layer under the patterned second SiGe layer, wherein the second fin type structure further includes the second part of the second SiGe layer.

14. The method of claim 13, further comprising:

an insulating layer covering completely a sidewall of the first part and covering partially a sidewall of the patterned silicon layer so that a lower portion of the patterned silicon layer is covered by the insulating layer and an upper portion of the patterned silicon layer is exposed, wherein the gate layer oxide completely covers the upper portion of the patterned silicon layer.

* * * * *